United States Patent
Summerfelt et al.

(10) Patent No.: US 8,268,696 B2
(45) Date of Patent: Sep. 18, 2012

(54) ALIGNMENT MARK FOR OPAQUE LAYER

(75) Inventors: Scott R. Summerfelt, Garland, TX (US); Stephen A. Meisner, Allen, TX (US); John B. Robbins, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 12/964,430

(22) Filed: Dec. 9, 2010

(65) Prior Publication Data

US 2011/0306176 A1 Dec. 15, 2011

Related U.S. Application Data

(62) Division of application No. 12/185,003, filed on Aug. 1, 2008.

(51) Int. Cl.
 *H01L 21/762* (2006.01)
(52) U.S. Cl. ........ 438/401; 438/462; 438/975; 257/797; 257/E21.525; 257/E23.001; 257/E23.179
(58) Field of Classification Search ............... 257/797, 257/E23.001, E23.179, E21.525; 438/401, 438/462, 975
See application file for complete search history.

(56) References Cited

U.S. PATENT DOCUMENTS

| | | | |
|---|---|---|---|
| 6,146,969 A * | 11/2000 | Tan et al. | 438/401 |
| 6,288,454 B1 * | 9/2001 | Allman et al. | 257/797 |
| 6,528,386 B1 | 3/2003 | Summerfelt et al. | |
| 6,660,612 B1 | 12/2003 | Chang et al. | |
| 2003/0157779 A1 * | 8/2003 | Diewald et al. | 438/401 |

* cited by examiner

*Primary Examiner* — Peniel M Gumedzoe
(74) *Attorney, Agent, or Firm* — Rose Alyssa Keagy; Wade J. Brady, III; Frederick J. Telecky, Jr.

(57) ABSTRACT

An IC alignment mark in a contact metal layer for use under an opaque layer, and a process for forming the alignment mark, are disclosed. The alignment mark includes contact metal fields, each several microns wide, with an array of PMD pillars in the interior, formed during contact etch, contact metal deposition and selective contact metal removal processes. The pillars are arrayed such that all exposed surfaces of the contact metal are planar. One configuration is a rectangular array in which every other row is laterally offset by one-half of the column spacing. Horizontal dimensions of the pillars are selected to maximize the contact metal fill factor, while providing sufficient adhesion to the underlying substrate during processing. The contact metal is at least 15 nanometers lower than the PMD layer surrounding the alignment mark, as a result of the contact metal removal process.

8 Claims, 5 Drawing Sheets

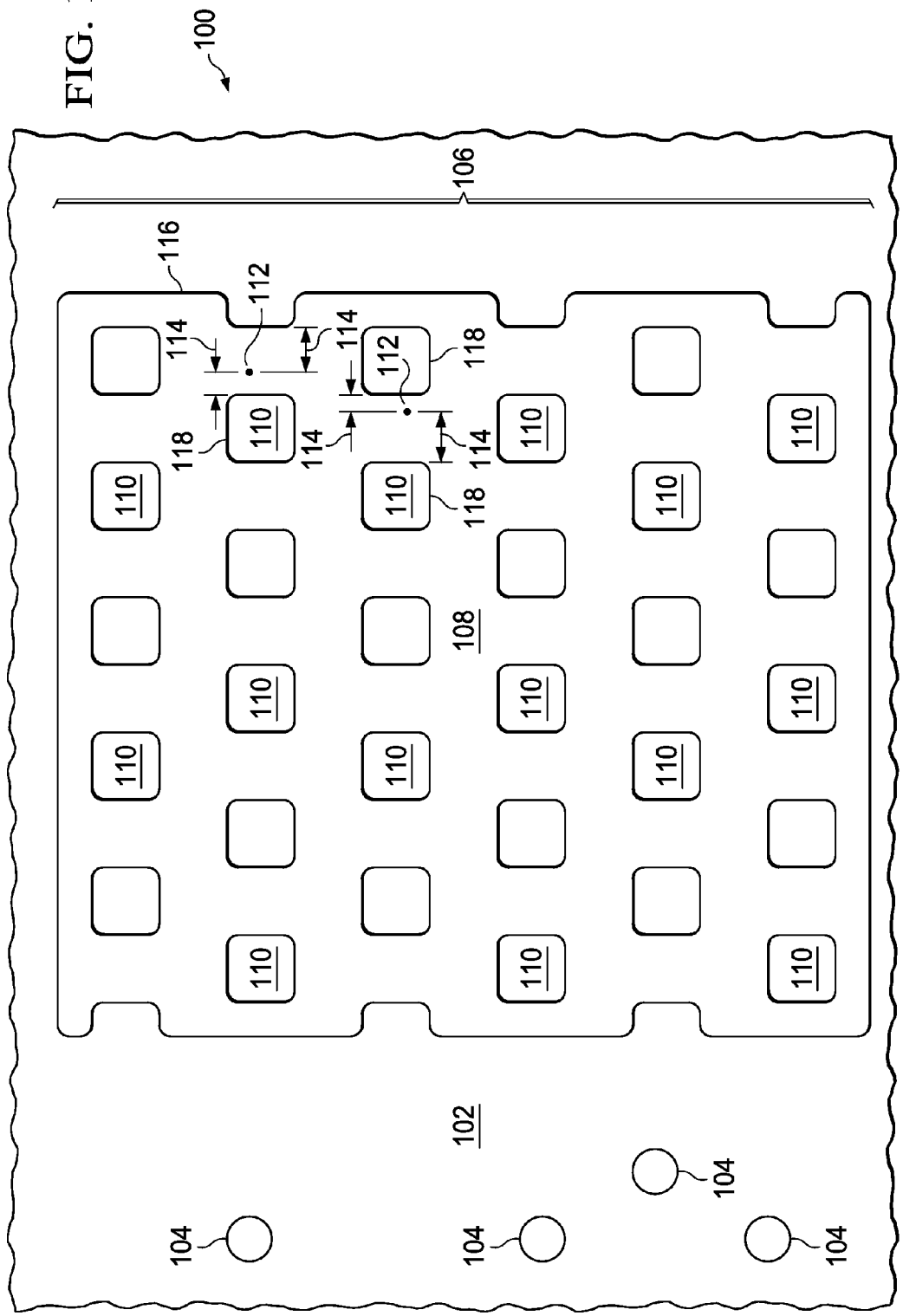

ALIGNMENT MARK FOR OPAQUE LAYER

This is a division of application Ser. No. 12/185,003, filed on Aug. 1, 2008, the entire disclosure of which is hereby incorporated by reference.

BACKGROUND OF THE INVENTION

This invention relates to the field of integrated circuits. More particularly, this invention related to methods to improve photolithographic alignment marks.

DESCRIPTION OF THE VIEWS OF THE DRAWING

FIG. 1 is a top view of an IC containing an alignment mark formed according to an embodiment of the instant invention.

DETAILED DESCRIPTION

Figure 2A:
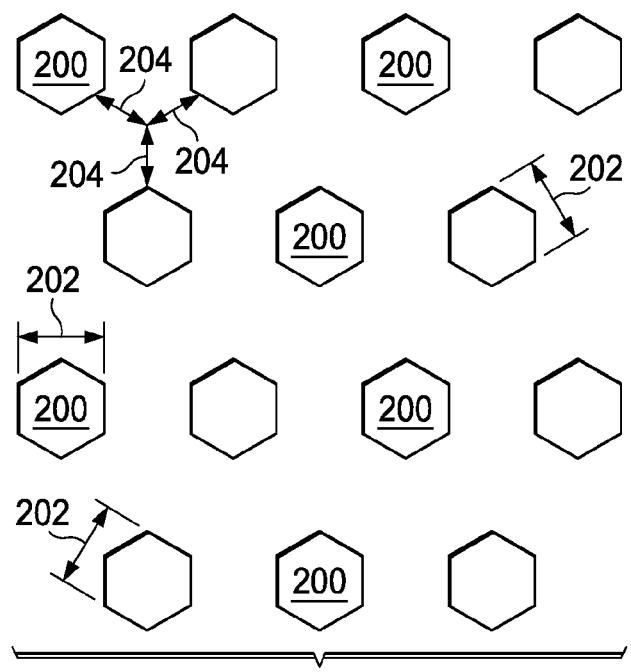
FIG. 2A through FIG. 2D depict configurations of PMD pillars in different embodiments of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a contact alignment mark for a contact metal layer in an integrated circuit (IC) for use when an overlying layer is opaque and a formation process for the opaque layer prohibits wide contact geometries in the contact layer, for example a reactive process used to form a ferroelectric material layer. The inventive alignment mark includes one or more alignment mark segments which are each at least several microns wide. Each alignment mark segment includes a contiguous contact metal field area, defined on a pre-metal dielectric (PMD) layer by a contact photoresist pattern. An array of pillars is defined in the contact metal field area by the contact photoresist pattern. PMD layer material in the contact metal field area is etched during the contact etch process, leaving an array of PMD pillars standing in the contact metal field area. Contact metal, preferably tungsten, is conformally deposited on the IC, such that a thickness of the deposited contact metal on vertical surfaces is approximately equal to a thickness of the deposited contact metal on horizontal surfaces. Contact metal fills the contact metal field area, filling spaces between and overlapping the PMD pillars. Contact metal on horizontal surfaces of the PMD layer and over the pillars is subsequently removed during contact formation processes, for example by chemical mechanical polishing (CMP), leaving contact metal in etched features in the PMD layer, including the contact metal field. The pillars are configured such that every location in the contact metal field is within a prescribed maximum horizontal distance from a boundary of the contact metal field. The boundary includes external edges of the contact metal field and perimeters of the PMD pillars. One configuration of pillars is a rectangular array in which every other row of pillars is laterally offset by one-half column spacing. The prescribed maximum lateral distance between any location in the contact metal field and a boundary of the contact metal field is chosen so that all exposed surfaces of the contact metal are essentially planar after contact metal removal processes have been completed. The prescribed maximum lateral distance will typically be approximately a deposition thickness of the contact metal on a planar surface. Horizontal sizes of the pillars are selected to minimize a combined area of all the pillars in the contact metal field, while providing sufficient adhesion of the pillars to an underlying substrate during formation of the inventive alignment mark. Experiments conducted during development of the instant invention indicate pillar sizes between 1.5 and 2.0 times the deposition thickness of the contact metal meet the recited criteria. A top surface of the contact metal field is preferably at least 15 nanometers lower than the PMD layer surrounding the alignment mark, as a result of the contact metal removal process.

An opaque layer may be formed over the alignment marks during a subsequent fabrication operation. The height difference between the alignment mark segments and the PMD layer provides detectable features which permits measurement of a position of the IC by conventional photolithographic processing equipment.

An advantage of the instant invention is the inventive alignment mark may be formed in an IC without adding fabrication cost or complexity.

FIG. 1 is a top view of an IC containing an alignment mark segment formed according to an embodiment of the instant invention. The IC (100) includes a PMD layer (102) formed over a substrate of the IC, not shown in FIG. 1 for clarity. Contacts (104) containing contact metal, typically tungsten, are formed in the PMD layer (102) to make electrical contact to circuit components, not shown in FIG. 1 for clarity, in the IC (100). The alignment mark segment (106) also contains a contact metal field (108) which is formed in the PMD layer (102) concurrently with the contacts (104). Pillars of PMD material (110), which are formed concurrently with the contacts (104), are arrayed in the contact metal field (106). Contact holes for the contacts (104) and a contact metal field area for the contact metal field are formed by photolithographically defining areas to be etched and removing unwanted PMD material using reactive ion etching methods. Contact metal is deposited as a conformal layer on the PMD layer (102) and extends into etched features in the PMD layer (102). Etched features in the PMD layer (102) which are narrower than approximately twice a thickness of the as-deposited contact metal layer on a horizontal surface of the PMD layer (102) are substantially filled with contact metal. The pillars (110) are configured such that any and every location (112) in the contact metal in the contact metal field (108) is within a prescribed maximum lateral distance (114) from a boundary of the contact metal field (108). The boundary of the contact metal field consists of an external edge (116) of the contact metal field (108) and the perimeters (118) of the pillars (110). In a preferred embodiment, the pillars (110) are uniform in size. In an example preferred embodiment, the pillars (110) are arranged in a rectangular array with every other row laterally offset by one-half a column spacing, as depicted in FIG. 1. The prescribed maximum lateral distance is selected such that a top surface of the contact metal in the contact metal field (108) is substantially flat after the contacts (104) are formed. The prescribed maximum lateral distance may reasonably be expected to be substantially equal to the thickness of the as-deposited contact metal layer on a horizontal surface of the PMD layer (102). In a preferred embodiment, the as-deposited contact metal layer is between 200 and 300 nanometers, and the prescribed maximum lateral distance is between 200 and 300 nanometers. A horizontal size of the pillars (110) is selected to minimize a combined area of all the pillars (110) in the contact metal field (108), while providing sufficient adhesion to the substrate during the contact etch and contact metal deposition processes, and associated wet clean processes. Experiments conducted during development of the instant invention indicate horizontal pillar sizes between 1.5 and 2.0 times the deposition thickness of the contact metal provide an acceptable balance between the aforementioned criteria.

FIG. 2A through FIG. 2D depict configurations of PMD pillars in different embodiments of the instant invention. Referring to FIG. 2A, each pillar (200) has a substantially hexagon shape, with a width (202) which is preferably between 1.5 and 2 times a deposition thickness of tungsten in a contact metal deposition process. A point substantially equidistant from three neighboring pillars is separated by a distance (204) from each pillar which is preferably substantially equal to the deposition thickness of tungsten in the contact metal deposition process. Every second row of pillars (200) is laterally offset by one-half of a column width.

Figure 2B:
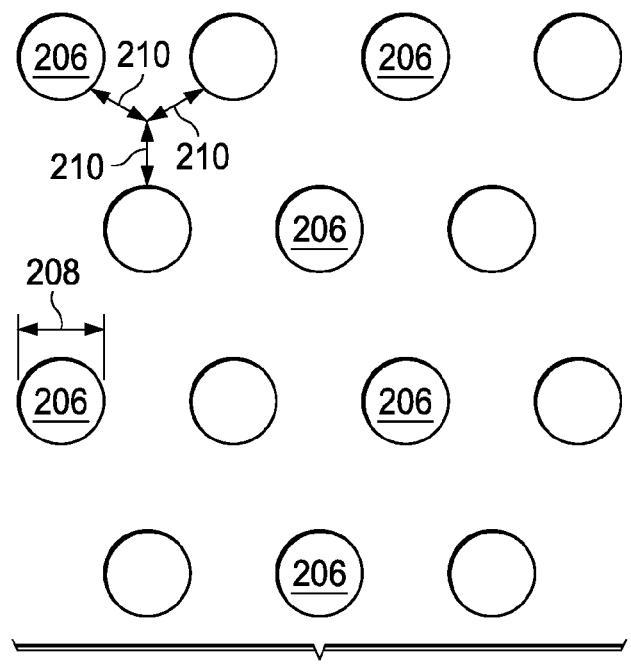

Referring to FIG. 2B, each pillar (206) has a substantially circular shape, with a diameter (208) which is preferably between 1.5 and 2 times a deposition thickness of tungsten in a contact metal deposition process. A point substantially equidistant from three neighboring pillars is separated by a distance (210) from each pillar which is preferably substantially equal to the deposition thickness of tungsten in the contact metal deposition process. Every second row of pillars (206) is laterally offset by one-half of a column width.

Figure 2C:
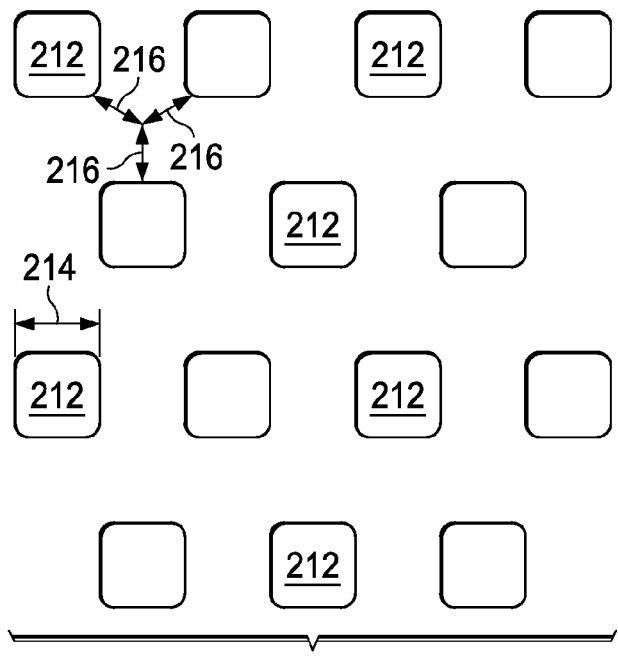

Referring to FIG. 2C, each pillar (212) has a substantially square shape with rounded corners, with a width (214) which is preferably between 1.5 and 2 times a deposition thickness of tungsten in a contact metal deposition process. A point substantially equidistant from three neighboring pillars is separated by a distance (216) from each pillar which is preferably substantially equal to the deposition thickness of tungsten in the contact metal deposition process. Every second row of pillars (212) is laterally offset by one-half of a column width.

Figure 2D:
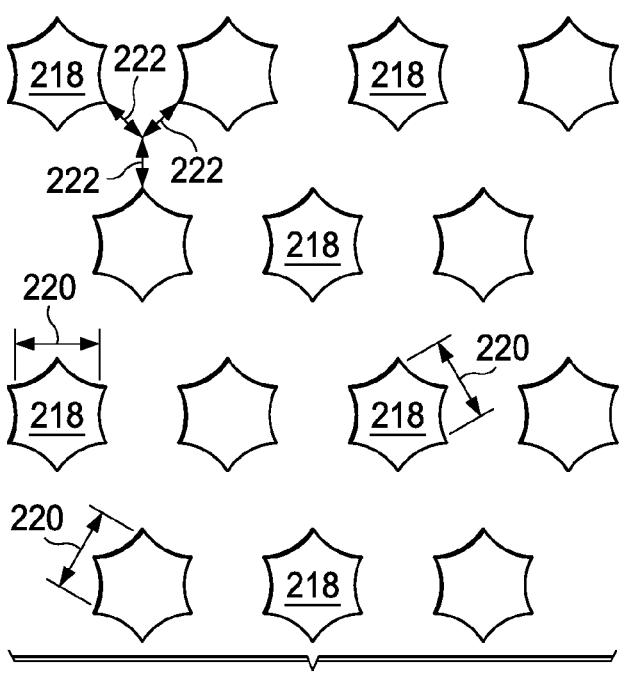

Referring to FIG. 2D, each pillar (218) has a substantially six-pointed star shape, with a width (220) which is preferably between 1.5 and 2 times a deposition thickness of tungsten in a contact metal deposition process. A point substantially equidistant from three neighboring pillars is separated by a distance (222) from each pillar which is preferably substantially equal to the deposition thickness of tungsten in the contact metal deposition process. Every second row of pillars (218) is laterally offset by one-half of a column width.

It is within the scope of the instant invention to form PMD pillars of other shapes than those disclosed in reference to FIG. 2A through FIG. 2D, for example, ellipsoidal or rectangular shaped pillars. It is within the scope of the instant invention to array the pillars in other configurations than the offset row configuration disclosed in reference to FIG. 1 and FIG. 2A through FIG. 2D, for example a rectangular array.

Figure 3A:
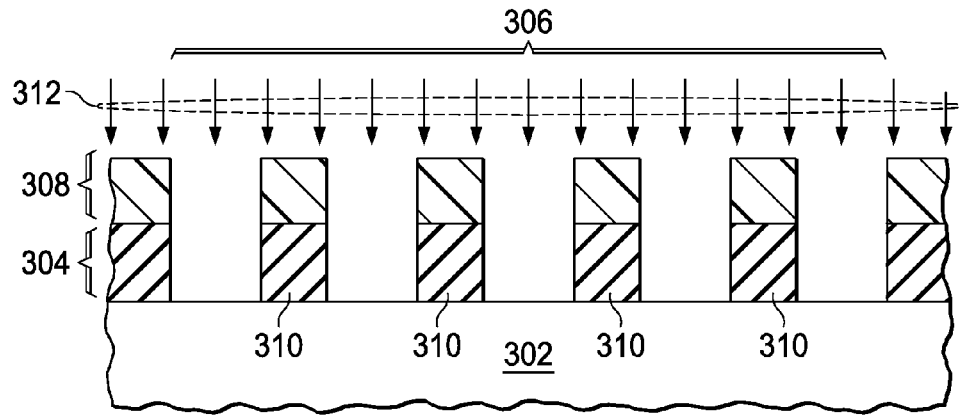
FIG. 3A through FIG. 3E are cross-sections of an IC containing an alignment mark segment formed according to an embodiment of the instant invention, depicted in successive stages of fabrication.

FIG. 3A through FIG. 3E are cross-sections of an IC containing an alignment mark segment formed according to an embodiment of the instant invention, depicted in successive stages of fabrication. Referring to FIG. 3A, the IC (300) is formed on a substrate (302), commonly a single crystal silicon wafer, but possibly a silicon-on-insulator (SOI) wafer or other substrate appropriate for fabricating the IC (300), including any layers or materials formed during fabrication of the IC (300) prior to formation of the inventive alignment mark. A PMD layer (304), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the substrate (302). An alignment mark segment (306) is defined on a top surface of the PMD layer (304) by a contact photoresist pattern (308) formed on a top surface of the PMD layer (304) using known photolithographic methods. Areas for PMD pillars (310) are defined by the contact photoresist pattern (308) in the alignment mark segment (306). The pillars (310) are configured as described in reference to FIG. 1 and FIG. 2A through FIG. 2D. A contact etch process (312), typically a reactive ion etch (RIE) process using a fluorine-containing plasma removes PMD material from the alignment mark segment (306). The contact photoresist pattern (308) is removed during subsequent processing, commonly by exposing the IC (300) to an oxygen containing plasma, followed by a wet cleanup to remove any organic residue from the top surface of the PMD layer (302).

Figure 3B:
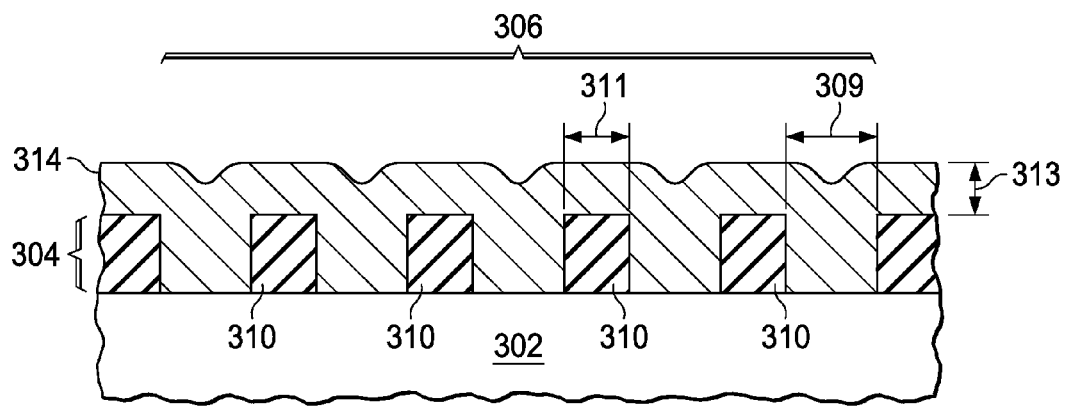

FIG. 3B depicts the IC (300) after a conformal layer of contact metal (314) is formed on exposed surfaces of the PMD layer (304) and substrate (302). A lateral distance (309) between pillars (310) is selected so that a top surface of the contact metal layer (314) in the spaces between the pillars (310) does not dip below a plane containing the top surface of the PMD layer (304). Typically, for commonly used contact metal deposition processes, a maximum space between pillars (310) will be substantially equal to twice an as-deposited thickness (313) of the contact metal layer (314) on the top surface of the PMD layer (304). A horizontal size (311) of the pillars (310) is selected minimize a combined area of the pillars (310) in the alignment mark segment (306), while providing sufficient adhesion of the pillars (310) to the substrate (302) during the contact etch, contact photoresist pattern removal and contact metal deposition processes. Experiments conducted during development of the instant invention indicate pillar widths (311) between 1.5 and 2.0 times the deposition thickness of the contact metal provide an acceptable balance between the aforementioned criteria.

Figure 3C:
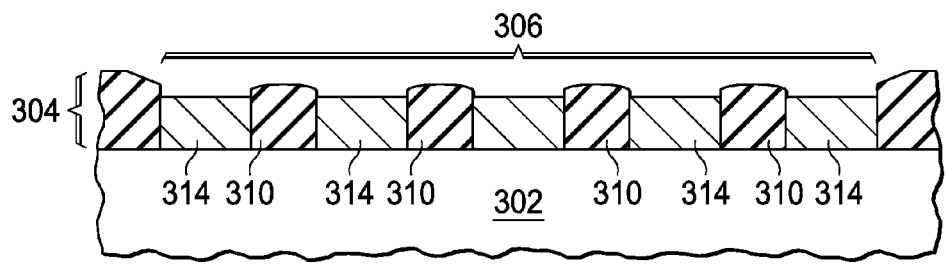

FIG. 3C depicts the IC (300) after a contact metal removal process which removes contact metal (314) from the top surface of the PMD layer (304). The contact metal removal process is typically a CMP operation, in which a removal rate of contact metal is more than a removal rate of PMD material, commonly more than 4 times the removal rate of PMD material. During a CMP operation, edges of the PMD layer (304) at the boundary of the alignment mark segment (306) are commonly rounded, as depicted in FIG. 3C. Due to the higher removal rate of contact metal (314) by the CMP operation, a top surface of the contact metal (314) in the alignment mark segment (306) is lower than a top surface of the PMD layer (304) outside the alignment mark segment (306), after the CMP operation is completed. PMD material in the pillars (310) is also removed by the CMP operation at a higher rate than PMD material outside the alignment mark segment (306).

Still referring to FIG. 3C, in an alternate embodiment, another process may be used to remove contact metal (314) from the horizontal surfaces of the PMD layer (304), for example a plasma etchback followed by a wet clean operation. Parameters of the contact metal removal process may be adjusted to provide a higher removal rate of the contact metal (314) in the alignment mark segment (306) than of the top surface of the PMD layer (304) outside the alignment mark segment (306).

Figure 3D:
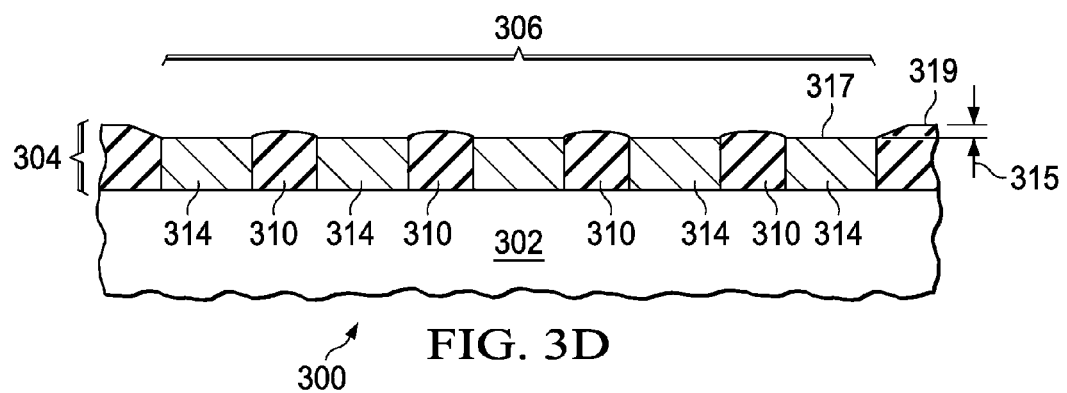

FIG. 3D depicts the IC (300) after an optional PMD etchback process which removes 5 to 15 nanometers of PMD material from the top surface of the PMD layer (304) while removing substantially no contact metal (314). The optional PMD etchback process is commonly performed to reduce a height difference between a top surface of contact metal in a contact to a circuit component, not shown in FIG. 3D for clarity, and the top surface of the PMD layer (304) surrounding the contact.

In a preferred embodiment, a height difference (315) between the contact metal top surface (317) in the alignment mark segment (306) and the PMD layer top surface (319) outside the alignment mark segment (306) is greater than 15 nanometers after contact formation processes, including optional etchbacks, have been completed.

Figure 3E:
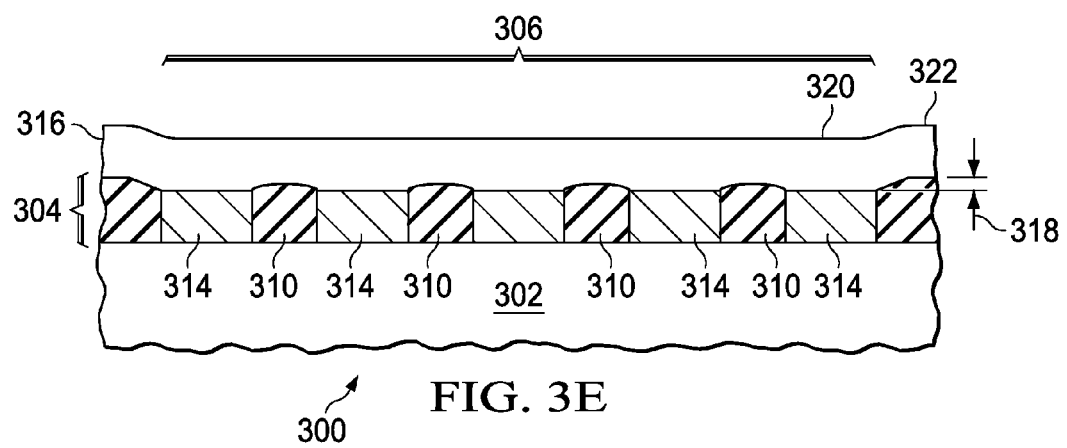

FIG. 3E depicts the IC (300) after formation of an opaque layer (316) on the top surface of the contact metal (314) and the pillars (310) in the alignment mark segment (306). For the purposes of this disclosure, opaque is understood to mean a transmission coefficient of the opaque layer is less than 1 percent at wavelengths used by conventional photolithographic equipment to measure a position of the IC using alignment marks. Typically, wavelengths used by conventional photolithographic equipment to measure the position of the IC range from 500 nanometers to 1000 nanometers, and are expected to extend down to 350 nanometers within a few years. In a preferred embodiment, a height difference (318) between a first top surface (320) of the opaque layer (316) in the alignment mark segment (306) is more than 15 nanometers below a second top surface (322) of the opaque layer (316) outside the alignment mark segment (306).

In one embodiment, the opaque layer (316) may be a ferroelectric capacitor layer stack including a layer of titanium nitride (TiN), a layer of titanium aluminum nitride (TiAlN), a first layer of iridium containing material, a layer of lead zirconium titanate (PZT), a second layer of iridium containing material and a second layer of TiAlN. The configuration of the pillars (310) in the alignment mark segment (306) which provides a planar top surface of the contact metal (314) is advantageous because the layer of TiN, the first layer of TiAlN and the first layer of iridium provide sufficient protection for the contact metal (314) that undesirable reaction of metal organic gases and oxygen with the contact metal (314) during formation of the PZT layer is prevented.

In another embodiment, the opaque layer (316) may be a layer of high electrical resistivity material as are commonly used for thin film resistors, such as alloys of silicon chromium (SiCr), alloys of silicon chromium carbide (SiCrC), alloys of nickel chromium (NiCr), alloys of nickel chromium with oxygen (NiCrO), alloys of nickel chromium silicon aluminum (NiCrSiAl), tantalum nitride (TaN), tantalum oxynitride (TaON), alloys of titanium chromium aluminum oxide (TiCrAlO), molybdenum silicide ($MoSi_2$), ceramic metal materials such as chromium silicon oxide (Cr(SiO)) or silicon chromium oxide (Si(CrO)), or metal oxide materials such as ruthenium oxide (RuO) or lanthanum oxide (LaO).

The embodiment discussed in reference to FIG. 3A through FIG. 3E is advantageous because the preferred height difference (318) between the first top surface of the opaque layer (316) in the alignment mark segment (306) and the second top surface of the opaque layer (316) outside the alignment mark segment (306) was provided without adding cost or complexity to a fabrication process sequence of the IC (300).

What is claimed is:

1. A process of forming an integrated circuit, comprising the steps of:
   providing a substrate;
   forming a dielectric layer on said substrate;
   forming an alignment mark segment in said dielectric layer, by a process further including the steps of:
      forming a contact photoresist pattern on a top surface of said dielectric layer which defines a contact metal field to be etched and an array of pillars of said dielectric layer in said contact metal field to be unetched;
      etching said dielectric layer through said contact photoresist pattern to remove dielectric layer material from said contact metal field and form an array of pillars of said dielectric layer in said contact metal field, whereby every location in said contact metal field is within a desired maximum horizontal distance from a boundary of said contact metal field, said boundary including edges of said contact metal field and perimeters of said pillars;
      depositing a conformal layer of contact metal on said top surface of said dielectric layer, on a top surface of said pillars and in said contact metal field;
      removing said contact metal from said top surface of said dielectric layer and said top surface of said pillars; and
      removing contact metal from a top surface of said contact metal such that the top surface of said contact metal in said contact metal field is at least 15 nanometers below a top surface of said dielectric layer surrounding said contact metal field; and
   forming an opaque layer on said top surface of said contact metal and a top surface of said pillars, such that a first top surface of said opaque layer over said contact metal field is at least 15 nanometers below a second top surface of said opaque layer outside said alignment mark segment.

2. The process of claim 1, in which said pillars are substantially uniform in size and a horizontal length of each pillar is substantially equal to a horizontal width of each pillar.

3. The process of claim 2, in which said pillars are arranged in a rectangular array in which every other row is laterally offset by one-half a column spacing.

4. The process of claim 3, in which said step of depositing a conformal layer of contact metal further includes depositing a conformal layer of tungsten.

5. The process of claim 4, in which said desired maximum lateral distance between every location in said contact metal field and said boundary of said contact metal field is between 200 and 300 nanometers.

6. The process of claim 5, in which said pillars are between 350 and 500 nanometers wide.

7. The process of claim 6, in which said step of forming an opaque layer further includes forming a layer of PZT.

8. The integrated circuit of claim 5, in which said opaque layer is selected from the group consisting of:
   an alloy of SiCr,
   an alloy of SiCrC, an alloy of NiCr,
an alloy of NiCrO,
an alloy of NiCrSiAl,
TaN,
TaON,
an alloy of TiCrAlO,
MoSi$_2$,
Cr(SiO),
Si(CrO),
RuO, and
LaO.

* * * * *